US012222540B2

(12) United States Patent
Matsunaga et al.

(10) Patent No.: US 12,222,540 B2
(45) Date of Patent: Feb. 11, 2025

(54) OPTICAL WAVEGUIDE PACKAGE AND LIGHT-EMITTING DEVICE (71) Applicant: KYOCERA Corporation, Kyoto (JP)

(72) Inventors: Shougo Matsunaga, Kirishima (JP); Yoshiaki Itakura, Aira (JP); Hiroshi Matsumoto, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/689,746

(22) PCT Filed: Sep. 5, 2022

(86) PCT No.: PCT/JP2022/033314
§ 371 (c)(1),
(2) Date: Mar. 6, 2024

(87) PCT Pub. No.: WO2023/038014
PCT Pub. Date: Mar. 16, 2023

(65) Prior Publication Data
US 2024/0377575 A1 Nov. 14, 2024

(30) Foreign Application Priority Data

Sep. 8, 2021 (JP) .................................. 2021-146101

(51) Int. Cl.
F21V 8/00 (2006.01)
(52) U.S. Cl.
CPC ............. G02B 6/009 (2013.01); G02B 6/005 (2013.01); G02B 6/0068 (2013.01); G02B 6/0073 (2013.01)

(58) Field of Classification Search
CPC ...... G02B 6/009; G02B 6/005; G02B 6/0068; G02B 6/0073
See application file for complete search history.

(56) References Cited

U.S. PATENT DOCUMENTS 6,112,002 A * 8/2000 Tabuchi ............... G02B 6/4245
385/124
2009/0245716 A1 * 10/2009 Kojima ................ G02B 6/4214
385/8

(Continued)

FOREIGN PATENT DOCUMENTS

JP 5-341143 A 12/1993
JP 08-130353 A 5/1996

(Continued)

OTHER PUBLICATIONS

English translation of Himeno JP-10308555-A (Year: 1998).*

Primary Examiner — Evan P Dzierzynski
(74) Attorney, Agent, or Firm — Volpe Koenig (57) ABSTRACT A light-emitting device includes an optical waveguide package, a light-emitting element in an element mount, and a lid covering the element mount. The optical waveguide package includes a substrate including a first surface, a cladding on the first surface and including a second surface facing the first surface, a third surface opposite to the second surface, and the element mount with an opening in the third surface, and a core in the cladding. The cladding includes a first portion having the core inside, and a second portion facing the first portion across the element mount. The first portion includes a plurality of first protrusions in an area of the third surface corresponding to the first portion. The second portion includes a plurality of second protrusions in an area of the third surface corresponding to the second portion.

10 Claims, 7 Drawing Sheets (56) References Cited

U.S. PATENT DOCUMENTS

| | | | |
|---|---|---|---|
| 2013/0163920 A1* | 6/2013 | Maetani | G02B 6/12 |
| | | | 427/163.2 |
| 2020/0150360 A1* | 5/2020 | Yanagisawa | G02B 6/132 |
| 2021/0157071 A1* | 5/2021 | Shikama | G02B 6/4243 |
| 2022/0350097 A1 | 11/2022 | Itakura et al. | |

FOREIGN PATENT DOCUMENTS

| | | | |
|---|---|---|---|
| JP | 10-160976 A | | 6/1998 |
| JP | 10308555 A | * | 11/1998 |
| JP | 2001-108873 A | | 4/2001 |
| WO | 2021/065078 A1 | | 4/2021 |

* cited by examiner

FIG. 8

OPTICAL WAVEGUIDE PACKAGE AND LIGHT-EMITTING DEVICE

TECHNICAL FIELD

The present disclosure relates to a light-emitting device.

BACKGROUND OF INVENTION

A known light-emitting device is described in, for example, Patent Literature 1.

CITATION LIST

Patent Literature

Patent Literature 1: Japanese Unexamined Patent Application Publication No. 10-308555

SUMMARY

In an aspect of the present disclosure, a light-emitting device includes a substrate including a first surface, a cladding on the first surface and including a second surface facing the first surface, a third surface opposite to the second surface, and an element mount with an opening in the third surface, a core in the cladding, a light-emitting element in the element mount, and a lid covering the element mount. The cladding includes a first portion having the core inside, and a second portion facing the first portion across the element mount. The first portion includes a plurality of first protrusions in a first area of the third surface corresponding to the first portion. The second portion includes a plurality of second protrusions in a second area of the third surface corresponding to the second portion.

BRIEF DESCRIPTION OF THE DRAWINGS

The objects, features, and advantages of the present disclosure will become more apparent from the following detailed description and the drawings.

DESCRIPTION OF EMBODIMENTS

A light-emitting device with the structure that forms the basis of a light-emitting device according to one or more embodiments of the present disclosure will be described first.

Patent Literature 1 describes a hybrid waveguide optical circuit having a recessed cutout in a cladding on a substrate to receive an optical element. The cutout is covered airtightly with a sealing lid. The hybrid waveguide optical circuit includes a surface planarizing layer surrounding the optical-element mount at least on the surface of the cladding or inside the cladding. This minimizes the amount of fixing agent used to fix the sealing lid to the cladding surface.

The light-emitting element generates heat, which transfers through the cladding. The light-emitting element is mounted near a core. The portion of the cladding having the core inside thus has a temperature different from the temperature of the other portion. This temperature difference causes different thermal expansions among the lid, the cladding, and a bond. The lid may thus partially separate from the cladding, possibly causing deterioration in airtightness.

Figure 1:
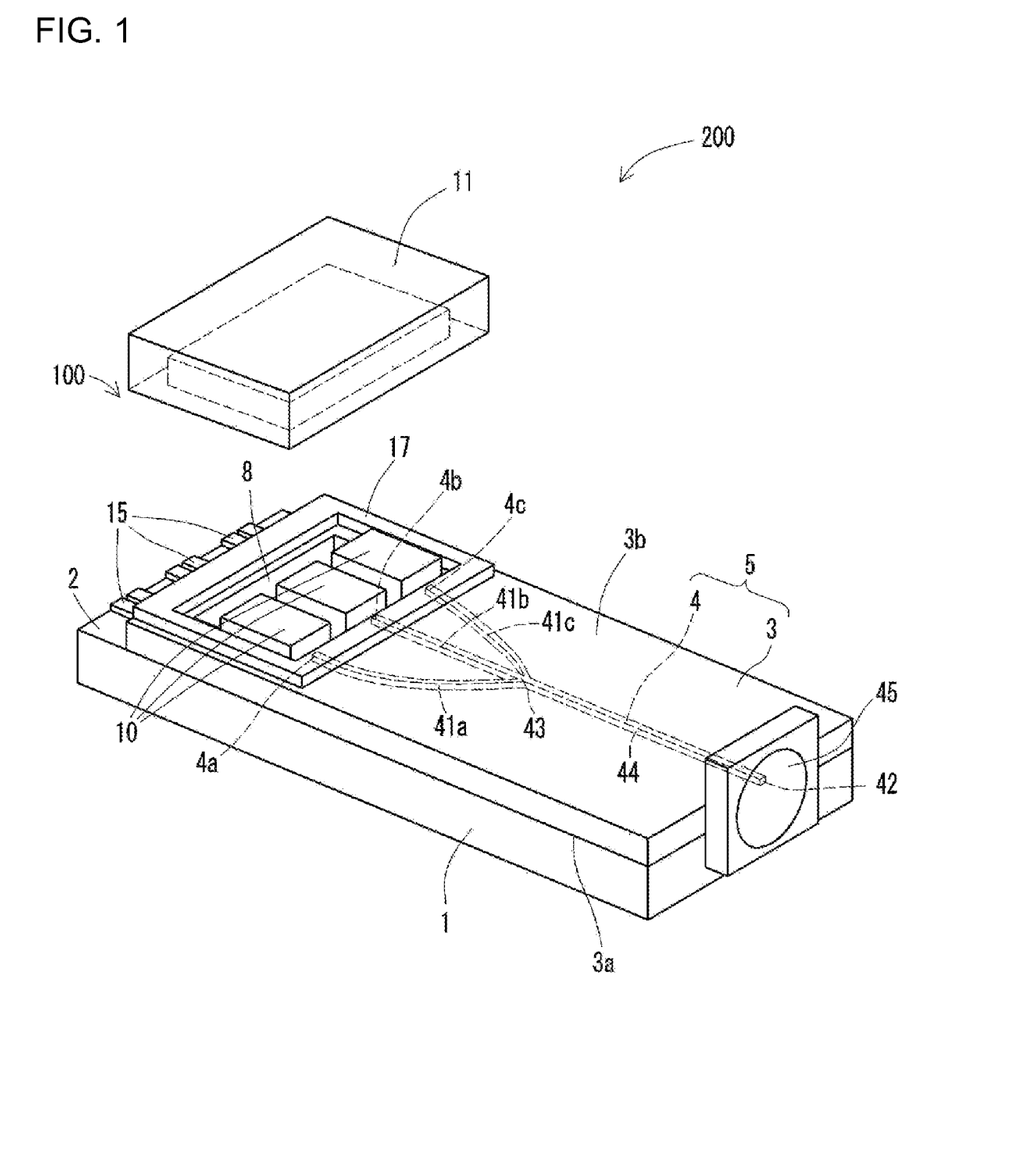
FIG. 1 is an exploded perspective view of a light-emitting device according to a first embodiment.
Figure 2:
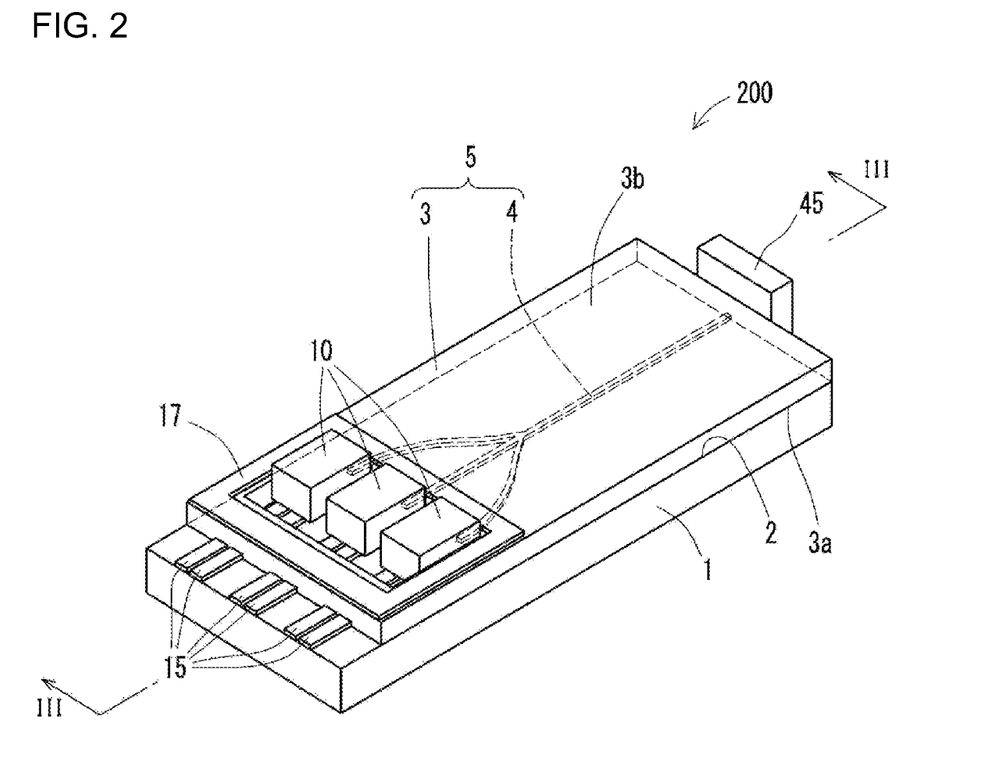
FIG. 2 is a perspective view of the light-emitting device without a lid.
Figure 3:
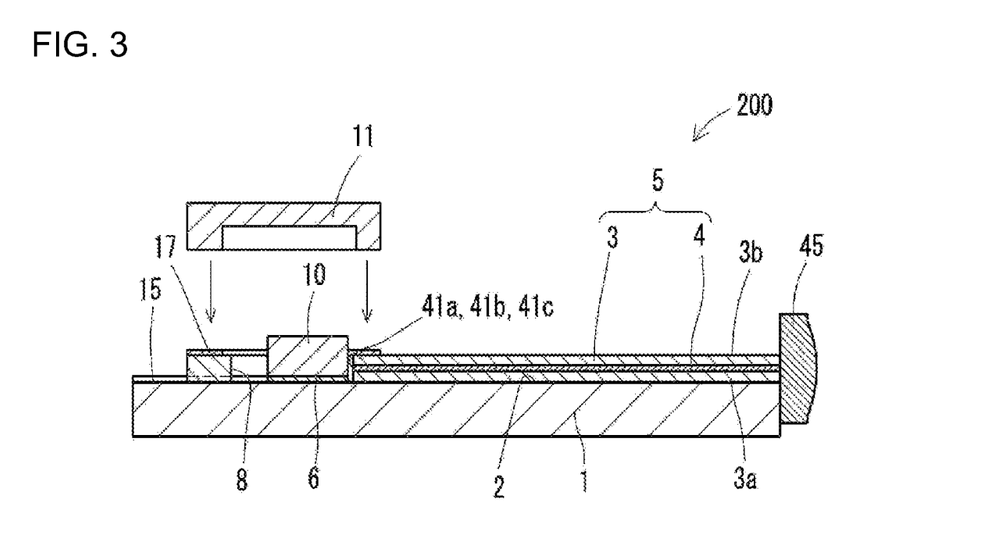
FIG. 3 is a cross-sectional view of the light-emitting device taken along line III-III in FIG. 2.
Figure 4:
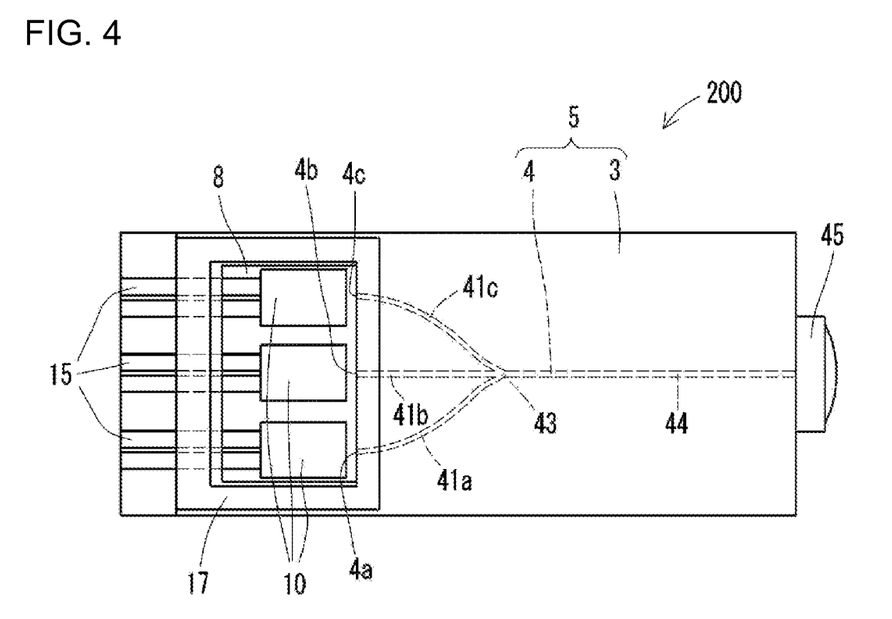
FIG. 4 is a plan view of the light-emitting device without the lid.

The light-emitting device according to one or more embodiments of the present disclosure will now be described with reference to the accompanying drawings. FIG. 1 is an exploded perspective view of a light-emitting device according to a first embodiment. FIG. 2 is a perspective view of the light-emitting device without a lid. FIG. 3 is a cross-sectional view of the light-emitting device taken along line III-III in FIG. 2. FIG. 4 is a plan view of the light-emitting device without the lid.

A light-emitting device 200 according to the first embodiment includes an optical waveguide package 100, light-emitting elements 10 in an element mount 8, and a lid 11 covering the element mount 8. The light-emitting device 200 according to the first embodiment further includes a lens 45 on the optical path of light emitted through a core 4. The optical waveguide package 100 includes a substrate 1 including a first surface 2, a cladding 3 located on the first surface 2 and including a second surface 3a facing the first surface 2, a third surface 3b opposite to the second surface 3a, and the element mount 8 with an opening in the third surface 3b, and the core 4 located in the cladding 3. The optical waveguide package 100 in the first embodiment further includes wires 15 for external connection located on the first surface 2 of the substrate 1.

In the present embodiment, the light-emitting device 200 includes three light-emitting elements 10 in the element mount 8 of the optical waveguide package 100. Each light-emitting element 10 is, for example, a light-emitting diode (LED) that emits red (R) light, green (G) light, or blue (B) light. The core 4 and the cladding 3 may be integral with each other to be an optical waveguide layer 5.

The substrate 1 may be a ceramic wiring board including dielectric layers made of a ceramic material. Examples of the ceramic material for the ceramic wiring board include sintered aluminum oxide, sintered mullite, sintered silicon carbide, sintered aluminum nitride, and sintered glass ceramic.

The substrate 1 may be an organic wiring board including dielectric layers made of, for example, an organic material. The organic wiring board may be, for example, a printed wiring board, a build-up wiring board, or a flexible wiring board. Examples of the organic material for the organic wiring board include an epoxy resin, a polyimide resin, a polyester resin, an acrylic resin, a phenolic resin, and a fluororesin.

The core 4 and the cladding 3 are included in the optical waveguide layer 5. The optical waveguide layer 5 may be made of, for example, glass such as quartz, or a resin. In the optical waveguide layer 5, both the core 4 and the cladding 3 may be made of glass or a resin. In some embodiments, one of the core 4 or the cladding 3 may be made of glass and the other may be made of a resin. The core 4 and the cladding 3 have different refractive indexes. The core 4 has a higher refractive index than the cladding 3. This difference in refractive index is used to fully reflect light at the interface between the core 4 and the cladding 3. More specifically, a material with a higher refractive index is used to form a path, which is then surrounded by a material with a lower refractive index. This structure confines light in the core 4 with the higher refractive index.

The core 4 includes multiple incident end faces 4a, 4b, and 4c and one emission end face 42. The core 4 includes multiple branching paths 41a, 41b, and 41c, a merging portion 43, and a joined path 44 between the incident end faces 4a, 4b, and 4c and the emission end face 42. The branching paths 41a, 41b, and 41c respectively include the incident end faces 4a, 4b, and 4c at one end. The branching paths 41a, 41b, and 41c merge together at the merging portion 43. The joined path 44 includes the emission end face 42 at one end.

Red (R) light, green (G) light, and blue (B) light emitted from the light-emitting elements 10 enter the respective branching paths 41a, 41b, and 41c through the respective incident end faces 4a, 4b, and 4c, pass through the merging portion 43 and the joined path 44, and are emitted through the emission end face 42. The light-emitting elements 10 are positioned in the element mount 8 with the center of each of the incident end faces 4a, 4b, and 4c of the branching paths 41a, 41b, and 41c aligned with the optical axis of the corresponding light-emitting element 10.

The element mount 8 may be a recess or a through-hole with an opening in the third surface 3b of the cladding 3. In the present embodiment, the element mount 8 is a through-hole extending from the third surface 3b to the second surface 3a of the cladding 3. In a plan view, a bond 17 surrounds the opening of the element mount 8 on the third surface 3b of the cladding 3. The bond 17 bonds the lid 11 to the third surface 3b of the cladding 3. The element mount 8 is sealed airtightly to protect the light-emitting elements 10.

The lid 11 may be made of a glass material such as quartz, borosilicate, or sapphire. The bond 17 may be made of any material that can airtightly bond the lid 11 to the cladding 3, such as Au—Sn or Sn—Ag—Cu solder, an Ag or Cu metal nanoparticle paste, or a glass paste.

The lens 45 is located on the optical path of light emitted through the core 4. The lens 45 may collimate or condense the light emitted through the core 4. The lens 45 is, for example, a plano-convex lens with a flat incident surface and a convex emission surface.

In the present embodiment, the light-emitting elements 10 are connected to the wires 15 for external connection. The wires 15 for external connection extend, for example, from inside the element mounts 8 to outside the element mounts 8 between the second surface 3a of the cladding 3 and the first surface 2 of the substrate 1. For light-emitting elements 10 with electrodes on their lower and upper surfaces, the lower electrodes are connected directly to the wires 15 for external connection, and the upper electrodes are connected to the wires 15 for external connection with, for example, bonding wires. For light-emitting elements 10 with electrodes on their lower surfaces, the two electrodes on the lower surface are connected directly to the wires 15 for external connection. The light-emitting elements 10 are electrically connected to an external control circuit with, for example, the wires 15 for external connection.

Figure 5A:
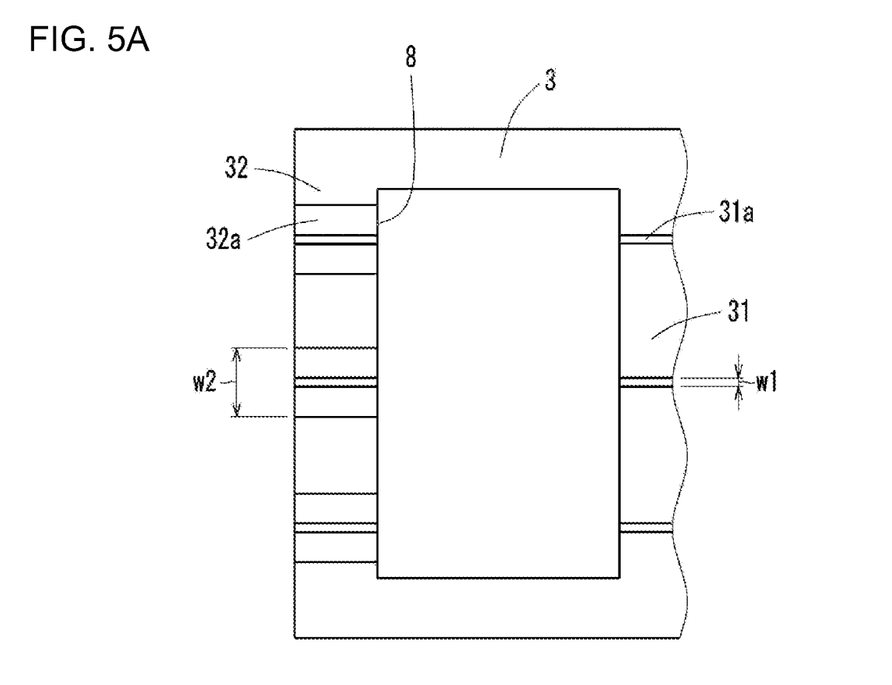
FIG. 5A is an enlarged plan view of a cladding in the first embodiment.
Figure 5B:
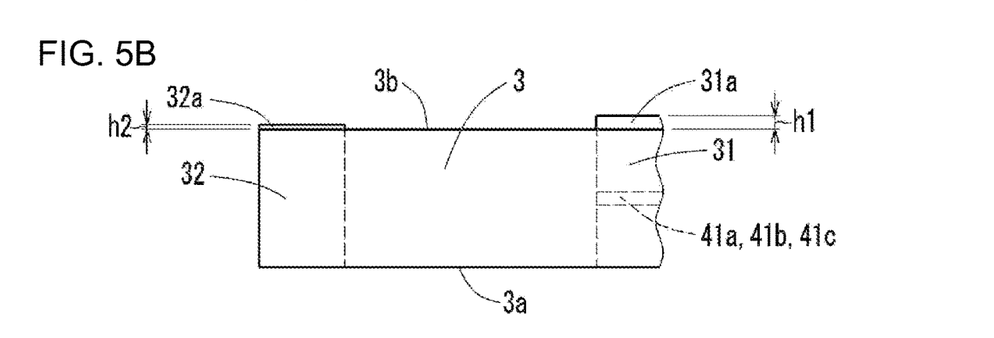
FIG. 5B is an enlarged side view of the cladding in the first embodiment.
Figure 5C:
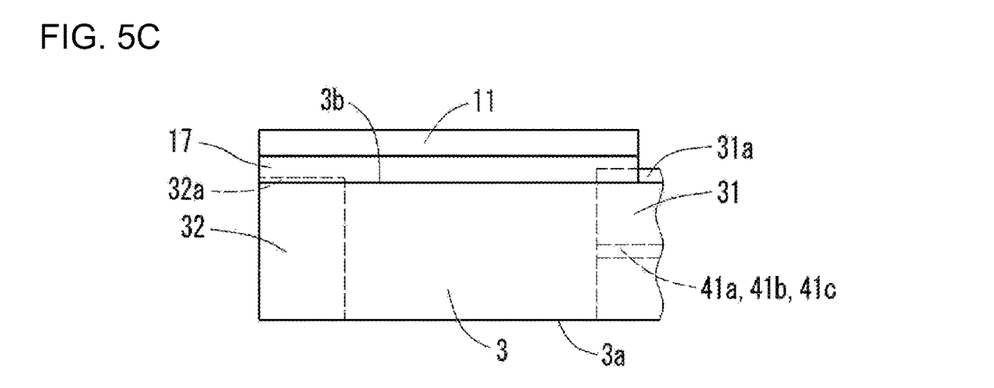
FIG. 5C is an enlarged side view of the cladding and the lid in the first embodiment.

The element mount 8 of the cladding 3 and its adjacent area will be described. FIG. 5A is an enlarged plan view of the cladding 3 in the first embodiment. FIG. 5B is an enlarged side view of the cladding 3 in the first embodiment. FIG. 5C is an enlarged side view of the cladding 3 and the lid 11 in the first embodiment. The cladding 3 includes a first portion 31 having the core 4 inside, and a second portion 32 facing the first portion 31 across the element mount 8. The first portion 31 includes multiple first protrusions 31a in a first area of the third surface 3b corresponding to the first portion 31. The second portion 32 includes multiple second protrusions 32a in a second area of the third surface 3b corresponding to the second portion 32.

To allow light emitted from the light-emitting elements 10 to enter the respective incident end faces 4a, 4b, and 4c, the light-emitting elements 10 are mounted closer to the first portion 31 having the core 4 inside than to the second portion 32 of the cladding 3 in the element mount 8. The light-emitting elements 10 generate heat during operation. In the cladding 3, the first portion 31 closer to the light-emitting elements 10 has a higher temperature than the second portion 32. In other words, the first portion 31 and the second portion 32 have a temperature difference. The cladding 3, the lid 11, and the bond 17 made of different materials may have different thermal expansions caused by the temperature difference between the first portion 31 and the second portion 32. The lid 11 may thus partially separate from the cladding 3, causing deterioration in airtightness. In the present embodiment, the first portion 31 includes the first protrusions 31a, and the second portion 32 includes the second protrusions 32a. The bonding area between the bond 17 and the cladding 3 is larger than when the cladding 3 has a flat surface. This improves the bonding strength and reduces deterioration in airtightness.

The first protrusions 31a and the second protrusions 32a extend in, for example, a first direction in which the first portion 31 and the second portion 32 face each other with a temperature difference between them. When thermally expanded, the bond 17 is deformable along the first protrusions 31a and the second protrusions 32a, reducing the stress caused by the thermal expansion. The first direction herein is the lateral direction in FIGS. 4 to 5C.

In the present embodiment, the first protrusions 31a are located above the core 4. The first protrusions 31a are fewer than the second protrusions 32a. The first protrusions 31a have a less width and a greater height than the second protrusions 32a. A height h1 of the first protrusions 31a and a height h2 of the second protrusions 32a are the dimensions from the third surface 3b of the cladding 3. A width w1 of the first protrusions 31a and a width w2 of the second protrusions 32a are the dimensions in a direction (second direction) perpendicular to the first direction in which the first protrusions 31a and the second protrusions 32a extend. This structure allows high adhesion to the lid 11 and thus improves reliability, although the portion adjacent to the first protrusions 31a has higher temperatures than the portion adjacent to the second protrusions 32a. This structure also allows the portion adjacent to the second protrusions 32a to have high adhesion to the lid 11 with the less likelihood of tilting of the lid 11 covering the element mount 8.

The first protrusions 31*a* and the second protrusions 32*a* may be formed by, for example, chemically treating, or for example, etching, or physically machining the third surface 3*b* of the cladding 3. Rods, strips, and others may be placed to form recesses and protrusions on the portions of the first surface 2 of the substrate 1 corresponding to the first portion 31 and the second portion 32 of the cladding 3. When the cladding 3 is formed on the first surface 2, recesses and protrusions are formed on the first portion 31 and the second portion 32 of the cladding 3 along the recesses and the protrusions on the first surface 2 of the substrate 1. The protrusions formed as described above serve as the first protrusions 31*a* and the second protrusions 32*a*. The first protrusions 31*a* and the second protrusions 32*a* may also be formed by placing, for example, the rods and the strips inside the cladding 3. For example, the first portion 31 may have the first protrusions 31*a* along the core 4 inside the cladding 3, and the second portion 32 may have the second protrusions 32*a* along the wires 15 for external connection on the first surface 2 of the substrate 1.

Figure 6A:
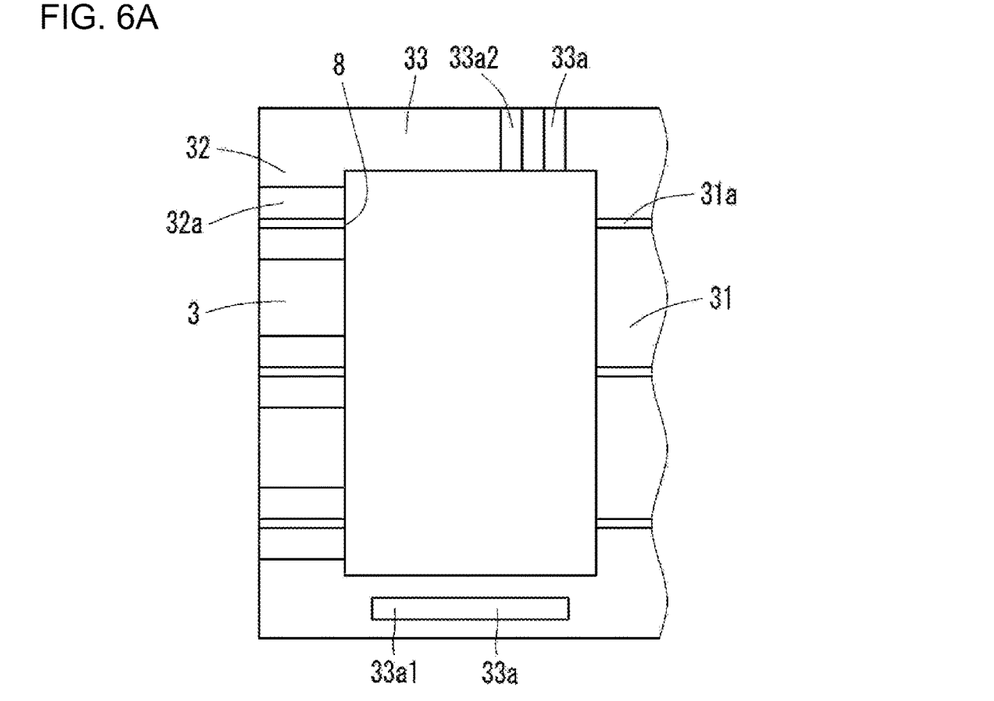
FIG. 6A is an enlarged plan view of a cladding in a second embodiment.
Figure 6B:
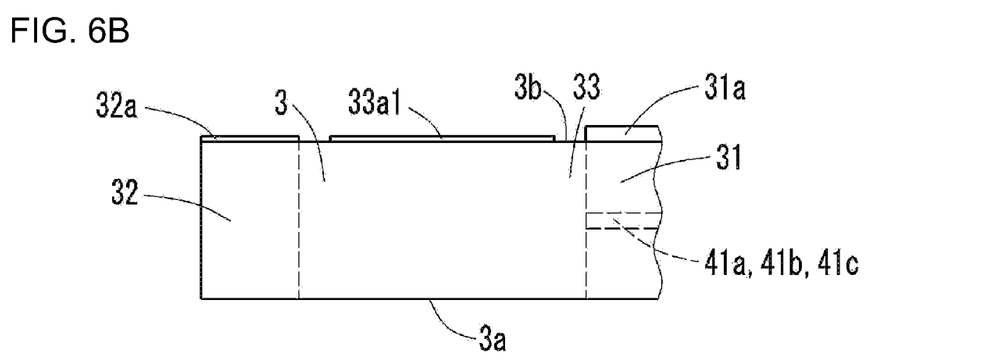
FIG. 6B is an enlarged side view of the cladding in the second embodiment.
Figure 6C:
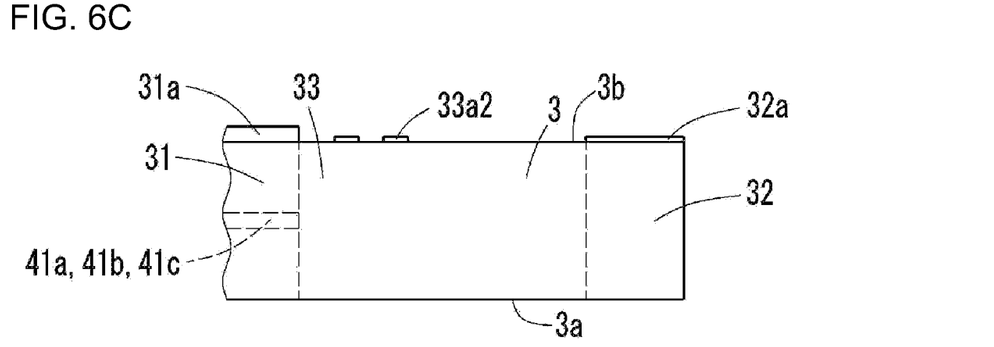
FIG. 6C is an enlarged side view of the cladding in the second embodiment.
Figure 6D:
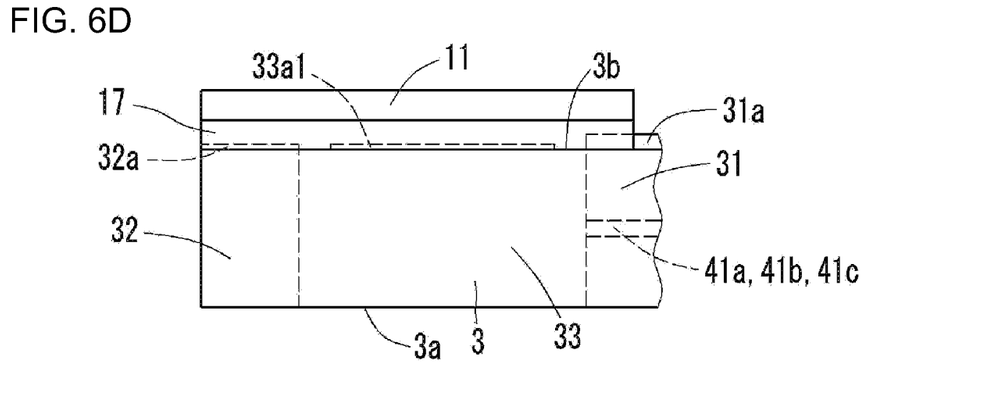
FIG. 6D is an enlarged side view of the cladding and a lid in the second embodiment.

A light-emitting device according to a second embodiment will be described. FIG. 6A is an enlarged plan view of a cladding in the second embodiment. FIGS. 6B and 6C are enlarged side views of the cladding in the second embodiment. FIG. 6D is an enlarged side view of the cladding and a lid in the second embodiment. The second embodiment is the same as the first embodiment except the structure of the cladding 3. The other components will not be described in detail. In the present embodiment, the cladding 3 further includes a third portion 33 between the first portion 31 and the second portion 32. The third portion 33 includes third protrusions 33*a* in a third area of the third surface 3*b* corresponding to the third portion 33. In the present embodiment, the third protrusions 33*a* further increase the bonding area between the bond 17 and the cladding 3 to improve the bonding strength and reduce deterioration in airtightness.

The third protrusions 33*a* include at least one of a protrusion 33*a1* extending in the first direction in which the first portion 31 and the second portion 32 face each other or a protrusion 33*a2* extending in the second direction perpendicular to the first direction. In the present embodiment, the third protrusions 33*a* include the protrusion 33*a1* extending in the first direction and the protrusion 33*a2* extending in the second direction. The third protrusions 33*a* may include the protrusion 33*a1* alone or the protrusion 33*a2* alone. With the third protrusions 33*a* including the protrusion 33*a1* and the protrusion 33*a2*, the bond 17 is deformable in the two directions when thermally expanded, with further reduction of the stress caused by the thermal expansion. Although the third protrusions 33*a* include the protrusion 33*a1* extending in the first direction in which the first portion 31 and the second portion 32 face each other and the protrusion 33*a2* extending in the second direction perpendicular to the first direction in the above example, the protrusion 33*a2* may extend in a direction intersecting with the first direction and produces the same or similar advantageous effects as described above.

Figure 7A:
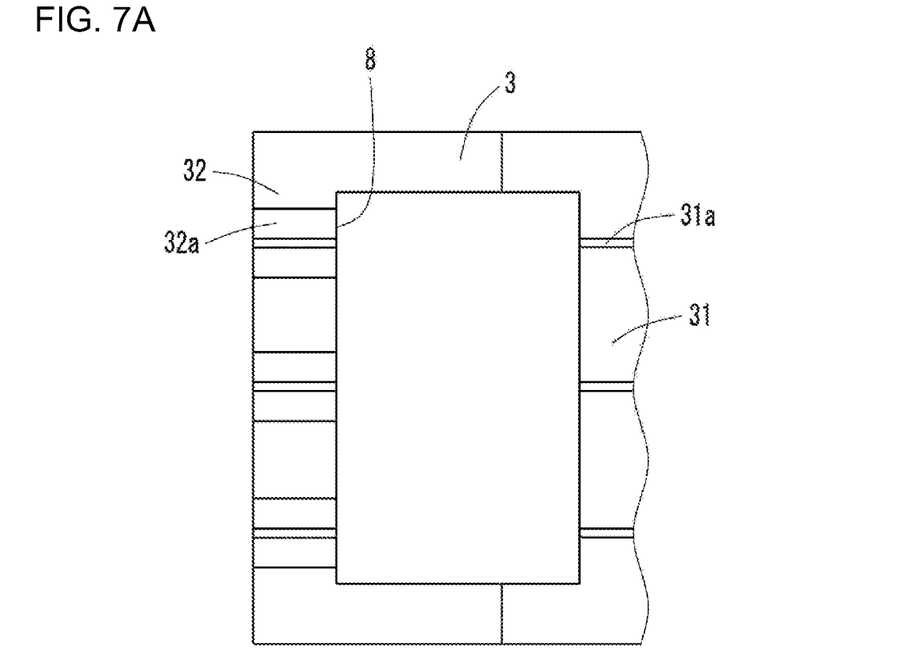
FIG. 7A is an enlarged plan view of a cladding in a third embodiment.
Figure 7B:
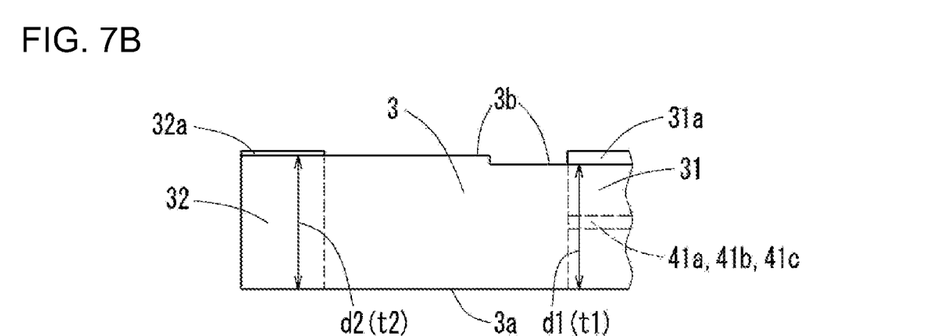
FIG. 7B is an enlarged side view of the cladding in the third embodiment.
Figure 7C:
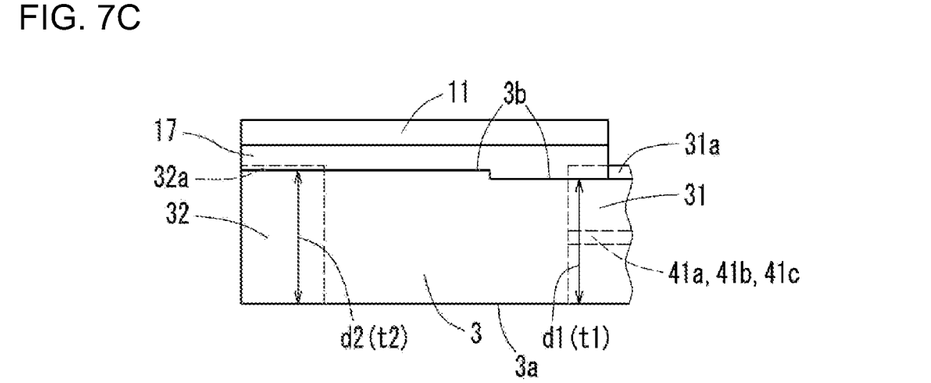
FIG. 7C is an enlarged side view of the cladding and a lid in the third embodiment.

A light-emitting device according to a third embodiment will be described. FIG. 7A is an enlarged plan view of a cladding in the third embodiment. FIG. 7B is an enlarged side view of the cladding in the third embodiment. FIG. 7C is an enlarged side view of the cladding and a lid in the third embodiment. The third embodiment is the same as the first embodiment except the structure of the cladding 3. The other components will not be described in detail. In the present embodiment, the cladding 3 has a distance d1 between the second surface 3*a* and the first area of the third surface 3*b* that is shorter than a distance d2 between the second surface 3*a* and the second area of the third surface 3*b*. In other words, the first portion 31 has a thickness t1 less than a thickness t2 of the second portion 32.

The third portion 33 between the first portion 31 and the second portion 32 may have the same thickness as, for example, the first portion 31 or the second portion 32. In the present embodiment, the third portion 33 has the same thickness as the second portion 32 in a portion adjacent to the second portion 32, and has the same thickness as the first portion 31 in a portion adjacent to the first portion 31. The third portion 33 thus includes a step. The third portion 33 may have a thickness continuously decreasing from the portion adjacent to the second portion 32 toward the portion adjacent to first portion 31. In this case, the third area of the third surface 3*b* is tilted.

Figure 8:
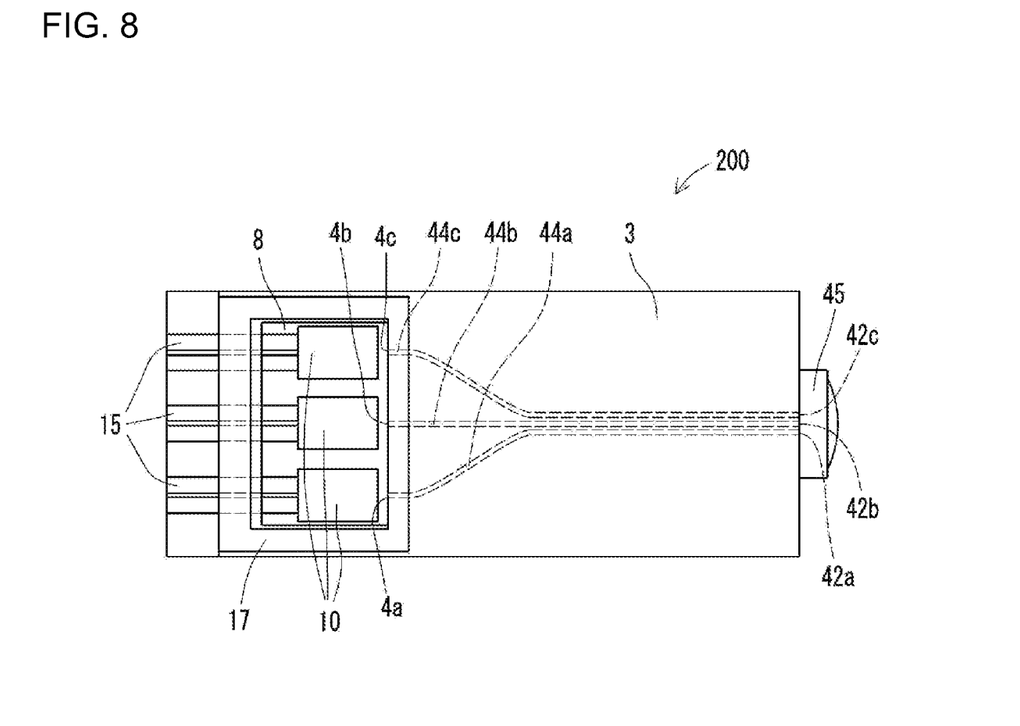
FIG. 8 is a plan view of a light-emitting device according to a fourth embodiment without a lid.

FIG. 8 is a plan view of a light-emitting device according to a fourth embodiment without a lid 11. In the first to third embodiments, the core 4 includes the three branching paths 41*a*, 41*b*, and 41*c* merged at the merging portion 43 to be the single joined path 44 including the single emission end face 42. The light-emitting device including an optical waveguide package according to the fourth embodiment may include three independent cores 44*a*, 44*b*, and 44*c* as in the plan view in FIG. 8. As in the above embodiments, the incident end faces 4*a*, 4*b*, and 4*c* of the three cores 44*a*, 44*b*, and 44*c* each have the center aligned with the optical axis of the corresponding light-emitting element 10. The three incident end faces 4*a*, 4*b*, and 4*c* are thus located apart from one another to align with the respective light-emitting elements 10. The three cores 44*a*, 44*b*, and 44*c* in the present embodiment include emission end faces 42*a*, 42*b*, and 42*c* located adjacent to one another. The three cores 44*a*, 44*b*, and 44*c* may be gathered adjacent to one another between the incident end faces 4*a*, 4*b*, and 4*c* and the emission end faces 42*a*, 42*b*, and 42*c*, and extend parallel to one another to the emission end faces 42*a*, 42*b*, and 42*c*. Light beams from the emission end faces 42*a*, 42*b*, and 42*c* of the respective cores may be emitted parallel to one another through, for example, the single lens 45. The images or others resulting from the emission light beams from the three emission end faces 42*a*, 42*b*, and 42*c* may be combined using, for example, an external device.

The lid 11 is bonded parallel to the third surface 3*b* of the cladding 3. The bond 17 levels the third surface 3*b* of the cladding 3 with any steps, recesses, or protrusions to maintain the lid 11 in parallel without being tilted. In the present embodiment, the cladding 3 has the first portion 31 thinner than the second portion 32. The bond 17 is thus thicker on the first portion 31 than on the second portion 32, maintaining the lid 11 in parallel without being tilted. The amount of the bond 17 on the first portion 31 that can have a higher temperature is greater than on the second portion 32 that can have a lower temperature. This reduces the difference in thermal expansion between the portions of the bond 17 resulting from the temperature difference. This reduces the likelihood of separation of the lid 11, thus reducing deterioration in airtightness.

When the bond 17 is, for example, Au—Sn solder, the bond 17 thicker on the first portion 31 can improve light-shielding and reduce light leakage between the lid 11 and the cladding 3.

The light-emitting elements 10 are not limited to LEDs, and may be, for example, laser diodes (LDs) or vertical-cavity surface-emitting lasers (VCSELs).

The light-emitting device according to one or more embodiments of the present disclosure may be implemented in forms (1) to (6) below.
(1) A light-emitting device, comprising:
a substrate including a first surface;
a cladding on the first surface, the cladding including a second surface facing the first surface, a third surface opposite to the second surface, and an element mount with an opening in the third surface;
a core in the cladding;
a light-emitting element in the element mount; and
a lid covering the element mount,
wherein the cladding includes a first portion having the core inside, and a second portion facing the first portion across the element mount,
the first portion includes a plurality of first protrusions in a first area of the third surface corresponding to the first portion, and
the second portion includes a plurality of second protrusions in a second area of the third surface corresponding to the second portion.
(2) The light-emitting device according to (1), wherein
the plurality of first protrusions is located above the core,
the plurality of first protrusions is fewer than the plurality of second protrusions,
the plurality of first protrusions has a less width than the plurality of second protrusions, and
the plurality of first protrusions has a greater height than the plurality of second protrusions.
(3) The light-emitting device according to (1) or (2), wherein
the cladding further includes a third portion between the first portion and the second portion, and
the third portion includes a third protrusion in a third area of the third surface corresponding to the third portion.
(4) The light-emitting device according to (3), wherein
the third protrusion includes at least one of a protrusion extending in a first direction in which the first portion and the second portion face each other or a protrusion extending in a second direction perpendicular to the first direction.
(5) The light-emitting device according to any one of (1) to (4), wherein
a distance between the second surface and the first area of the third surface is shorter than a distance between the second surface and the second area of the third surface.
(6) The light-emitting device according to any one of (1) to (5), further comprising:
a lens on an optical path of light to be emitted through the core.

The light-emitting device according to one or more embodiments of the present disclosure has less deterioration in airtightness.

Although the embodiments of the present disclosure have been described in detail, the present disclosure is not limited to the embodiments described above, and may be changed or varied in various manners without departing from the spirit and scope of the present disclosure.

The components described in the above embodiments may be entirely or partially combined as appropriate unless any contradiction arises.

REFERENCE SIGNS 1 substrate
2 first surface
3 cladding
3a second surface
3b third surface
4; 44a, 44b, 44c core
4a, 4b, 4c incident end face
optical waveguide layer
8 element mount
light-emitting element
11 lid
wire for external connection
17 bond
31 first portion
31a first protrusion
32 second portion
32a second protrusion
33 third portion
33a third protrusion
33a1 protrusion
33a2 protrusion
41a branching path
42; 42a, 42b, 42c emission end face
43 merging portion
44 joined path
45 lens
100 optical waveguide package
200 light-emitting device

The invention claimed is:

1. An optical waveguide package, comprising:
a substrate including a first surface;
a cladding on the first surface, the cladding including a second surface facing the first surface, a third surface opposite to the second surface, and an element mount with an opening in the third surface; and
a core in the cladding,
wherein the element mount is an area for mounting a light-emitting element,
the cladding includes a first portion having the core extending in a first direction of the substrate, and a second portion around the element mount and in a different position from the first portion,
the first portion includes a first protrusion, or a plurality of first protrusions, in a first area of the third surface corresponding to the first portion,
the second portion includes a plurality of second protrusions in a second area of the third surface corresponding to the second portion, and
the plurality of first protrusions is located above the core.

2. The optical waveguide package according to claim 1, wherein
the plurality of first protrusions is fewer than the plurality of second protrusions, and
the plurality of first protrusions has a less width than the plurality of second protrusions.

3. The optical waveguide package according to claim 2, wherein
the plurality of first protrusions has a greater height than the plurality of second protrusions.

4. The optical waveguide package according to claim 1, wherein
the second portion faces the first portion across the element mount in the first direction,
the cladding further includes a third portion between the first portion and the second portion, and
the third portion includes a third protrusion in a third area of the third surface corresponding to the third portion.

5. The optical waveguide package according to claim 4, wherein the third protrusion includes at least one of a protrusion extending in the first direction or a protrusion extending in a second direction perpendicular to the first direction.

6. The optical waveguide package according to claim 1, wherein
a distance between the second surface and the first area of the third surface is shorter than a distance between the second surface and the second area of the third surface.

7. A light-emitting device, comprising:
the optical waveguide package according to claim 1;
a light-emitting element in the element mount; and
a lid on the element mount.

8. The optical waveguide package according to claim 1, further comprising:
wires for external connection extending from inside the element mount to outside the element mount,
wherein the plurality of second protrusions is located above the wires for external connection.

9. The optical waveguide package according to claim 1, wherein
the core in the first portion includes a first core, a second core and a third core which extend in the first direction,
the first core, the second core and the third core are located apart from one another and are adjacent to one another with increasing distance from the element mount.

10. The optical waveguide package according to claim 1, wherein
the core in the first portion includes branching paths merged to be a joined path including a single emission end face.

\* \* \* \* \*